United States Patent
Li et al.

(10) Patent No.: US 10,254,353 B2
(45) Date of Patent: Apr. 9, 2019

(54) BROWN OUT DETECTOR HAVING SEQUENTIAL CONTROL FUNCTION

(71) Applicant: CSMC TECHNOLOGIES FAB1 CO., LTD., Wuxi New District (CN)

(72) Inventors: Youhui Li, Wuxi New District (CN); Xiaoli Xu, Wuxi New District (CN)

(73) Assignee: CSMC TECHNOLOGIES FAB1 CO., LTD., Wuxi New District (CN)

( * ) Notice: Subject to any disclaimer, the term of this patent is extended or adjusted under 35 U.S.C. 154(b) by 128 days.

(21) Appl. No.: 15/327,956

(22) PCT Filed: Jun. 30, 2015

(86) PCT No.: PCT/CN2015/082965
§ 371 (c)(1),
(2) Date: Jan. 20, 2017

(87) PCT Pub. No.: WO2016/015538
PCT Pub. Date: Feb. 4, 2016

(65) Prior Publication Data
US 2017/0205470 A1 Jul. 20, 2017

(30) Foreign Application Priority Data
Jul. 28, 2014 (CN) .......................... 2014 1 0364548

(51) Int. Cl.
*G01R 31/40* (2014.01)
*G01R 19/165* (2006.01)
(Continued)

(52) U.S. Cl.
CPC ............. *G01R 31/40* (2013.01); *G01R 15/04* (2013.01); *G01R 19/165* (2013.01); *G01R 19/16552* (2013.01); *G06F 1/28* (2013.01)

(58) Field of Classification Search
CPC .............. G01R 31/40; G01R 19/16552; G01R 19/165; G01R 15/04
See application file for complete search history.

(56) References Cited

U.S. PATENT DOCUMENTS 5,564,010 A * 10/1996 Henry ...................... G06F 1/24
714/22
5,943,635 A * 8/1999 Inn .................... G01R 19/16547
326/80

(Continued)

FOREIGN PATENT DOCUMENTS

CN 200962514 Y 10/2007
CN 101216788 A 7/2008

(Continued)

OTHER PUBLICATIONS

English Translation of International Search Report for International Application No. PCT/CN2015/082965, dated Sep. 30, 2015.

(Continued)

*Primary Examiner* — Tung X Nguyen
*Assistant Examiner* — Dominic E Hawkins
(74) *Attorney, Agent, or Firm* — Kagan Binder, PLLC

(57) ABSTRACT

A brown-out detection circuit having a time sequence control function comprises: a voltage divider (110), a reference voltage source (120), a comparator (130) and a time sequence control module (140); wherein one terminal of the voltage divider (110) is connected to an external power supply, the other terminal of the voltage divider (110) is connected to a positive input of the comparator (130), the reference voltage source (120) is connected to an inverted input of the comparator (130), the time sequence control module (140) is connected to an output of the comparator (130), an output of the time sequence control module (140) serves as an output of the brown-out detection circuit; when a duration of a power supply voltage lower than a reference (Continued)

voltage is not shorter than a preset time, the time sequence control module (140) controls the output of the brown-out detection circuit to be inverted from a high level to a low level.

12 Claims, 2 Drawing Sheets

(51) Int. Cl.
*G01R 15/04* (2006.01)
*G06F 1/28* (2006.01)

(56) References Cited

U.S. PATENT DOCUMENTS

| | | | |
|---|---|---|---|
| 7,589,568 B2* | 9/2009 | Steedman | G01R 19/16552 327/143 |
| 8,253,453 B2* | 8/2012 | Vilas Boas | H03K 17/223 327/143 |
| 2002/0067145 A1* | 6/2002 | Ribarich | H05B 41/2828 315/291 |
| 2004/0239413 A1* | 12/2004 | Gubbins | H03K 17/145 327/539 |
| 2009/0268488 A1* | 10/2009 | Fujii | H02M 1/32 363/49 |
| 2013/0027089 A1* | 1/2013 | Huang | G01R 19/16552 327/87 |
| 2014/0077842 A1* | 3/2014 | Zhang | G06F 1/30 327/72 |
| 2014/0167823 A1* | 6/2014 | Paek | H03K 17/223 327/143 |

FOREIGN PATENT DOCUMENTS

| | | |
|---|---|---|
| CN | 201222222 Y | 4/2009 |
| CN | 101470501 A | 7/2009 |
| CN | 101819261 A | 9/2010 |
| CN | 102116822 A | 7/2011 |
| CN | 103138716 A | 6/2013 |
| CN | 103529281 A | 1/2014 |
| WO | 99/30173 A1 | 6/1999 |

OTHER PUBLICATIONS

Deng et al., U.S. Appl. No. 14/902,516, International Application filed Jul. 29, 2014.
Zhong et al., U.S. Appl. No. 14/902,517, International Application filed Jul. 22, 2014.
Zhang et al., U.S. Appl. No. 14/902,519, International Application filed Aug. 19, 2014.
Wang et al., U.S. Appl. No. 14/902,302, International Application filed Sep. 2, 2014.
Zhang et al., U.S. Appl. No. 15/023,049, International Application filed Dec. 2, 2014.
Jing et al., U.S. Appl. No. 15/023,057, International Application filed Dec. 4, 2014.
Hu et al., U.S. Appl. No. 15/119,249, International Application filed May 8, 2015.
Wang et al., U.S. Appl. No. 15/119,289 International Application filed Apr. 29, 2015.
Qian et al., U.S. Appl. No. 15/119,311, International Application filed May 6, 2015.
Zhang et al., U.S. Appl. No. 15/308,574, International Application filed May 4, 2015.
Han et al., U.S. Appl. No. 15/318,857, International Application filed Jun. 30, 2015.
Hu et al., U.S. Appl. No. 15/312,146, International Application filed May 5, 2015.
Yao, U.S. Appl. No. 15/315,168, International Application filed Jun. 26, 2015.
Office Action for Chinese Patent Application No. 201410364548.4, dated Oct. 23, 2017, 13 pages (6 pages of Official Office Action, 7 pages of English Translation).

* cited by examiner

BROWN OUT DETECTOR HAVING SEQUENTIAL CONTROL FUNCTION

FIELD OF THE INVENTION

The present invention relates to a technical field of power supply control, and particularly relates to a brown-out detection circuit having a time sequence control function.

BACKGROUND OF THE INVENTION

The conventional brown-out detection circuits (BOD) are comparatively simple, the working principle of which is shown in FIG. 1: when the power supply voltage Vcc operates normally, the output Bout of BOD is the high level. When the power supply voltage Vcc is lower than a certain threshold Vth, Bout is changed to the low level immediately.

However, the conventional BOD is very sensitive to noise of the power supply voltage and interference, especially when the threshold Vth and the power supply voltage Vcc have a little difference and noise and interference cause Vcc to be lower than the threshold Vth, even if the duration of noise and interference is very short, Bout will also become to be the low level, so that the anti-noise ability and the anti-interference ability of the system will be weak.

SUMMARY OF THE INVENTION

Accordingly, it is necessary to provide a brown-out detection circuit having a time sequence control function, which has strong capacities of anti-noise and anti-interference.

A brown-out detection circuit having a time sequence control function includes: a voltage divider, a reference voltage source, a comparator and a time sequence control module; wherein one terminal of the voltage divider is connected to an external power supply, the other terminal of the voltage divider is connected to a positive input of the comparator, the reference voltage source is connected to an inverted input of the comparator, the time sequence control module is connected to an output of the comparator, an output of the time sequence control module serves as an output of the brown-out detection circuit; when a duration of a power supply voltage lower than a reference voltage is not shorter than a preset time, the time sequence control module controls the output of the brown-out detection circuit to be inverted from a high level to a low level.

The aforementioned brown-out detection circuit having a time sequence control function is provided with the time sequence control module, when the power supply voltage is lower than the reference voltage only for a preset time due to noise and interference, the time sequence control module does not response to the brown-out behavior, so that the output of the circuit will be not inverted from the high level to the low level, that is to say, the anti-noise ability and the anti-interference ability of the circuit are enhanced.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The above objects, features and advantages of the present invention will become more apparent by describing in detail embodiments thereof with reference to the accompanying drawings. It should be understood that the specific embodiments described herein are used to illustrate the present invention, rather than limit the present invention.

Figure 1:
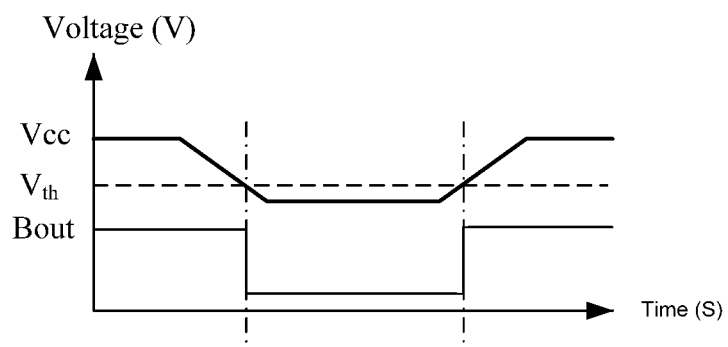
FIG. 1 is a schematic working principle diagram of a conventional brown-out detection circuit.
Figure 2:
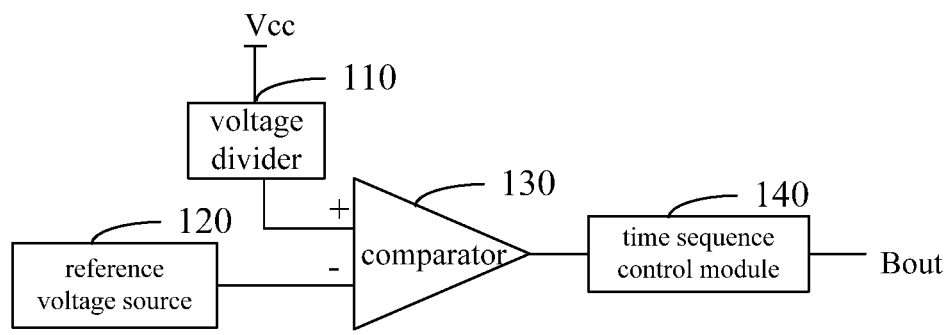
FIG. 2 is a block diagram of a brown-out detection circuit having a time sequence control function according to an embodiment.

Referring to FIG. 2, in an embodiment, a block diagram of a brown-out detection circuit having a time sequence control function is shown.

The brown-out detection circuit having a time sequence control function includes: a voltage divider 110, a reference voltage source 120, a comparator 130 and a time sequence control module 140.

One terminal of the voltage divider 110 is connected to an external power supply, the other terminal of the voltage divider 110 is connected to a positive input of the comparator 130, the reference voltage source 120 is connected to an inverted input of the comparator 130, the time sequence control module 140 is connected to an output of the comparator 130, an output of the time sequence control module 140 serves as an output of the brown-out detection circuit; when a duration of the voltage of a power supply Vcc lower than a reference voltage source is not shorter than a preset time, the time sequence control module 140 controls the output of the brown-out detection circuit to be inverted from a high level to a low level.

In the embodiment, the reference voltage of the reference voltage source 120 is a BGR reference voltage Vth, that is to say, the reference voltage is generated by a BGR circuit (Bandgap Reference Circuit). The BGR reference voltage Vth does not substantially vary with the power supply voltage and temperature. The preset time is 2 microseconds. It can be understood that in other embodiments the preset time can also be set as required, such as 3 microseconds, which is not limited herein.

In the embodiment, the comparator 130 is a hysteresis comparator. The hysteresis comparator is a comparator with the hysteresis loop transmission characteristics. A positive feedback network is introduced based on the inverted input single threshold voltage comparator, which forms an inverted input hysteresis comparator with double thresholds of an upper threshold voltage Vbod+ and a lower threshold voltage Vbod−. The sum of the upper threshold voltage Vbod+ and the lower threshold voltage Vbod− divided by 2 is equal to the BGR reference voltage Vth.

Generally, the width of the hysteresis window can be changed by adjusting the ratio of the load current source of the hysteresis comparator (the width of the hysteresis window is the difference between the upper threshold voltage Vbod+ and the lower threshold voltage Vbod−). If the width of the hysteresis window is too small, the capacity to suppress noise and interference will be weak. If the width of the hysteresis window is too large, the response to change in the power supply voltage will be slower. Generally, the value of the hysteresis window is on the order of 50 mV to 100 mV.

Figure 3:
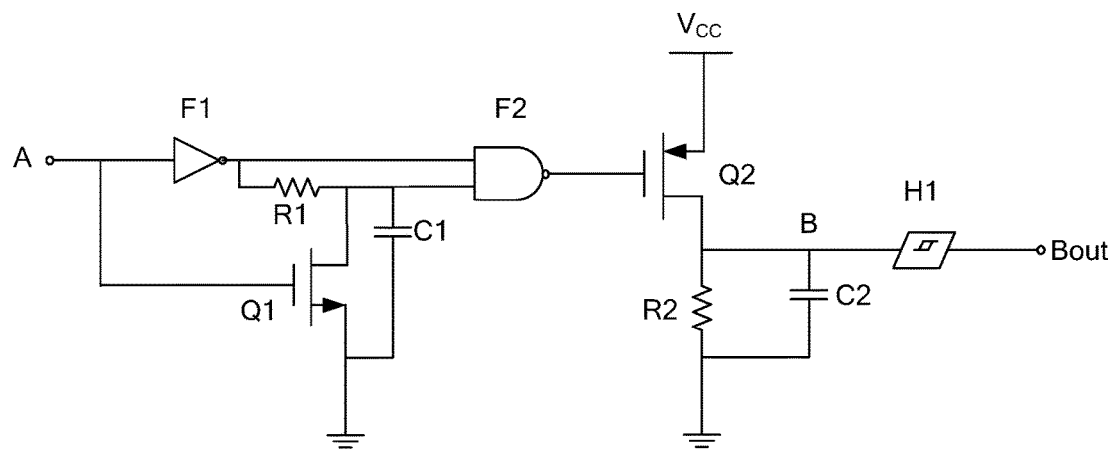
FIG. 3 is a circuit principle diagram of the time sequence control module shown in FIG. 2.

In an embodiment, a specific circuit principle diagram of the time sequence control module 140 is provided, as shown in connection with FIG. 3.

The time sequence control module 140 comprises a NOT gate F1, a NAND gate F2, a first resistor R1, a second resistor R2, a first capacitor C1, a second capacitor C2, a Schmidt trigger H1, a first switching transistor Q1 and a second switching transistor Q2.

An output of the comparator 130 is connected to an input of the NOT gate F1, an output of the NOT gate F1 is connected to a first input of the NAND gate F2, the first resistor R1 is connected between the output of the NOT gate F1 and a second input of the NAND gate F2, a control terminal of the first switching transistor Q1 is connected to the output of the comparator 130, an input of the first switching transistor Q1 is connected to the output of the NOT gate F1 by the first resistor R1, an output of the first switching transistor Q1 is grounded, the first capacitor C1 is connected between the input and the output of the first switching transistor Q1.

An output of the NAND gate F2 is connected to a control terminal of the second switching transistor Q2, an input of the second switching transistor Q2 is connected to a power supply, an output of the second switching transistor Q2 is grounded by the second resistor R2, the second capacitor C2 is connected between two terminals of the second resistor R2 in parallel, an input of the Schmidt trigger H1 is connected to the output of the second switching transistor Q2.

In the embodiment, the Schmidt trigger H1 is used as a level inverse unit, the first resistor R1 and the second resistor R2 can be used as the first impedance element and the second impedance element respectively. It can be understood that in other embodiments, in the case that the power supply environment is good, the Schmidt trigger H1 can be replaced by a NOT gate. Herein, the Schmidt trigger H1 is used for further improving the anti-noise ability and the anti-interference ability of the circuit.

In other embodiments, the first resistor R1 and the second resistor R2 can be replaced by two MOS transistors working in the linear region, and types of the two MOS transistors are the same. In the embodiment, the first capacitor C1 and the second capacitor C2 can be one of the MIM (Metal-Insulator-Metal) capacitor, the PIP (Polysilicon-Insulator-Polysilicon) capacitor and the MOS (Metal-Oxide-Semiconductor) capacitor.

Further, in the embodiment, the first switching transistor Q1 and the second transistor Q2 are an NMOS transistor and a PMOS transistor respectively, the control terminal, the input and the output of the first switching transistor Q1 correspond to a gate, a drain and a source of the NMOS transistor respectively; the control terminal, the input and the output of the second switching transistor Q2 correspond to a gate, a source and a drain of the PMOS transistor respectively. It can be understood that in other embodiments the first switching transistor Q1 and the second transistor Q2 can be other elements with similar functions.

In the following, the working principle of the above circuit is illustrated in connection with FIG. 2 and FIG. 3.

When the power supply voltage Vcc is lower than the lower threshold voltage Vbod−, the output of the comparator 130, i.e. point A, is the low level, which is changed to the high level after passing through the NOT gate F1. The high level, on the one hand, serves as the input to the first input of the NAND gate F2 and, on the other hand, charges the first capacitor C1 through the first resistor R1, whereby the voltage of the second input of the NAND gate is gradually raised, while the first transistor Q1 is turned off. Provided that the resistance value of the first resistor R1 and the capacitance value of the first capacitor C1 are $R_1$ and $C_1$ respectively, then the charging time constant of the first capacitor C1 is $1/R_1C_1$. When the duration of the low level at point A reaches a preset time (the preset time is determined together by the resistance value $R_1$, the capacitance value $C_1$, and the inverse voltage of the NAND gate F2, which is 2 microseconds in the embodiment), the voltage of the second input of the NAND gate F2 is inverted, the output voltage of the NAND gate F2 will become low, and the second switching transistor is turned on. At this time, point B becomes the high level, which is changed to the low level by the Schmitt trigger H1, that is to say, the circuit output Bout is the low level.

Figure 4:
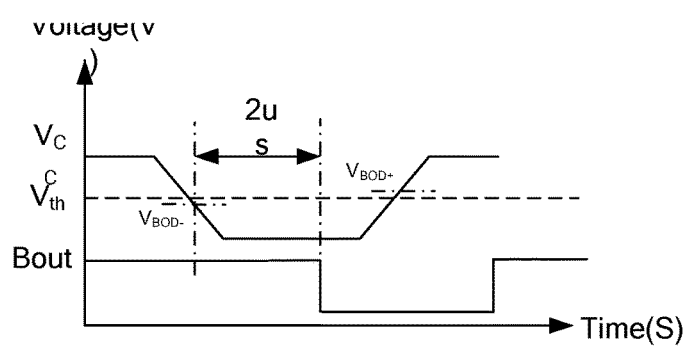
FIG. 4 is a schematic working principle diagram of the brown-out detection circuit having the time sequence control function shown in FIG. 2.

When the power supply voltage Vcc is higher than the upper threshold voltage Vbod+, the output of the comparator 130, i.e. point A, is the high level, which is changed to the low level after passing through the NOT gate F1. The low level, on the one hand, serves as the input to the first input of the NAND gate F2, while the first switching transistor Q1 is turned on and the second input of the NAND gate F2 is pulled to the low level, so that the output of the NAND gate F2 is the high level, and the second switching transistor Q2 is turned off. Here the first switching transistor Q1 is used to clear the cumulative effect of charging C1 for several consecutive short low level pulses by point A. At this time, the electric charge on the second capacitor C2 is discharged through the second resistor R2. Provided that the resistance value of the second resistor R2 and the capacitance value of the second capacitor C2 are $R_2$ and $C_2$ respectively, then the discharge time constant of the second capacitor C2 is $1/R_2C_2$. The voltage of point B is gradually decreased. When the voltage of point B is lower than the trigger level of Schmitt trigger (the time that the voltage of point B changes from the high level to the trigger level of Schmitt trigger is determined together by the resistance value $R_2$, the capacitance value $C_2$ and the trigger level of the Schmitt trigger H1, which is set to 2 microseconds in the embodiment), the output of the Schmitt trigger is the high level, that is to say, the circuit output Bout is also the high level. The specific working principle of the circuit is shown in FIG. 4.

The above brown-out detection circuit having a time sequence control function is provided with the time sequence control module, when the power supply voltage is lower than the reference voltage only for a preset time due to noise and interference, the time sequence control module does not react to the brown-out behavior, so that the output of the circuit will be not inverted from the high level to the low level, that is to say, the anti-noise ability and the anti-interference ability of the circuit are enhanced.

Various technical features of the above embodiments can be combined in any manner. In order to simplify description, all possible combinations of various technical features of the above embodiments are not described. However, as long as combinations of these technical features do not contradict with each other, they should be deemed to lie within the scope described in the specification.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A brown-out detection circuit having a time sequence control function, comprising:

a voltage divider, a reference voltage source, a comparator, and a time sequence control module; wherein one terminal of the voltage divider is connected to an external power supply, the other terminal of the voltage divider is connected to a positive input of the comparator, the reference voltage source is connected to an inverted input of the comparator, the time sequence control module is connected to an output of the comparator, an output of the time sequence control module serves as an output of the brown-out detection circuit; when a duration of a power supply voltage lower than a reference voltage is not shorter than a preset time at the output of the comparator, the time sequence control module controls the output of the brown-out detection circuit to be inverted from a high level to a low level; wherein the preset time is a function of a circuit receiving the output of the comparator which provides inputs to a first level inverse unit and first switching transistor, inputs of a second inverse unit including an output of the first inverse unit and an output of the first switching transistor which is coupled to a first RC circuit with a first time constant; and wherein inputs of a second switching transistor include the external power supply and the output of the second inverse unit, the output of the second switching transistor coupled to a second RC circuit with a second time constant, the output of the second RC circuit connected to a third level inverse unit, the output of which is the brown-out detection circuit.

2. The brown-out detection circuit of claim 1, characterized in that, the preset time is 2 microseconds.

3. The brown-out detection circuit of claim 1, characterized in that, the reference voltage of the reference voltage source is generated by a Bandgap Reference circuit.

4. The brown-out detection circuit of claim 1, characterized in that, the comparator is a hysteresis comparator.

5. A brown-out detection circuit having a time sequence control function, comprising:

a voltage divider, a reference voltage source, a comparator, and a time sequence control module; wherein one terminal of the voltage divider is connected to an external power supply, the other terminal of the voltage divider is connected to a positive input of the comparator, the reference voltage source is connected to an inverted input of the comparator, the time sequence control module is connected to an output of the comparator, an output of the time sequence control module serves as an output of the brown-out detection circuit; when a duration of time of a power supply voltage being lower than a reference voltage is not shorter than a preset time, the time sequence control module controls the output of the brown-out detection circuit to be inverted from a high level to a low level;

wherein the time sequence control module comprises a NOT gate, a NAND gate, a first impedance element, a second impedance element, a first capacitor, a second capacitor, a level inverse unit, a first switching transistor, and a second switching transistor;

wherein an output of the comparator is connected to an input of the NOT gate, an output of the NOT gate is connected to a first input of the NAND gate, the first impedance element is connected between the output of the NOT gate and a second input of the NAND gate, a control terminal of the first switching transistor is connected to the output of the comparator, an input of the first switching transistor is connected to the output of the NOT gate by the first impedance element, an output of the first switching transistor is grounded, the first capacitor is connected between the input and the output of the first switching transistor;

wherein an output of the NAND gate is connected to a control terminal of the second switching transistor, an input of the second switching transistor is connected to a power supply, an output of the second switching transistor is grounded by the second impedance element, the second capacitor is connected between two terminals of the second impedance in parallel, an input of the level inverse unit is connected to the output of the second switching transistor.

6. The brown-out detection circuit of claim 5, characterized in that, the level inverse unit comprises a NOT gate.

7. The brown-out detection circuit of claim 5, characterized in that, the level inverse unit comprises a Schmidt trigger.

8. The brown-out detection circuit of claim 5, characterized in that, the first impedance element comprises a resistor, and the second impedance element comprises a resistor.

9. The brown-out detection circuit of claim 5, characterized in that, the first impedance element comprises a MOS transistor working in a linear region, and the second impedance element comprises a MOS transistor working in a linear region.

10. The brown-out detection circuit of claim 5, characterized in that, the first switching transistor and the second transistor are an NMOS transistor and a PMOS transistor, respectively; the control terminal, the input, and the output of the first switching transistor correspond to a gate, a drain, and a source of the NMOS transistor, respectively; the control terminal, the input, and the output of the second switching transistor correspond to a gate, a source, and a drain of the PMOS transistor, respectively.

11. The brown-out detection circuit of claim 5, characterized in that, the first capacitor is one of a Metal-Insulator-Metal capacitor, a Polysilicon-Insulator-Polysilicon capacitor, and a MOS capacitor.

12. The brown-out detection circuit of claim 5, characterized in that, the second capacitor is one of a Metal-Insulator-Metal capacitor, a Polysilicon-Insulator-Polysilicon capacitor, and a MOS capacitor.

* * * * *